United States Patent
Chung et al.

(10) Patent No.: US 10,620,043 B2
(45) Date of Patent: Apr. 14, 2020

(54) LIGHT DETECTION CIRCUIT AND DETECTION METHOD THEREOF, AND LIGHT DETECTION DEVICE

(71) Applicant: BOE TECHNOLOGY GROUP CO., LTD., Beijing (CN)

(72) Inventors: Chiehhsing Chung, Beijing (CN); Chihlei Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/110,507

(22) Filed: Aug. 23, 2018

(65) Prior Publication Data

US 2019/0204147 A1 Jul. 4, 2019

(30) Foreign Application Priority Data

Jan. 3, 2018 (CN) .......................... 2018 1 0004403

(51) Int. Cl.
| | |
|---|---|
| *G01J 1/44* | (2006.01) |
| *H01L 27/144* | (2006.01) |
| *H01L 31/02* | (2006.01) |
| *H01L 31/0224* | (2006.01) |
| *H01L 31/0352* | (2006.01) |
| *H01L 31/113* | (2006.01) |

(52) U.S. Cl.
CPC ............ *G01J 1/44* (2013.01); *H01L 27/1443* (2013.01); *H01L 31/02019* (2013.01); *H01L 31/022408* (2013.01); *H01L 31/035218* (2013.01); *H01L 31/1136* (2013.01); *G01J 2001/4473* (2013.01)

(58) Field of Classification Search
CPC .. H01L 31/1136; H01L 31/113; H01L 31/112; H01L 31/10; H01L 31/032; H01L 31/03762; H01L 31/02019; H01L 27/1443; H01L 27/144; H01L 27/146; H01L 31/035218; G01J 1/44; G01J 2001/4473
See application file for complete search history.

(56) References Cited

U.S. PATENT DOCUMENTS

| | | | |
|---|---|---|---|
| 7,580,084 B2* | 8/2009 | Yu .................... | G02F 1/13338 345/104 |
| 7,800,602 B2* | 9/2010 | Choi .................. | G06F 3/042 345/173 |
| 2007/0109239 A1* | 5/2007 | den Boer ............ | G02F 1/13338 345/87 |

(Continued)

*Primary Examiner* — John R Lee
(74) *Attorney, Agent, or Firm* — Nath, Goldberg & Meyer; Joshua B. Goldberg

(57) ABSTRACT

A light detection circuit and a detection method thereof, and a light detection device are provided. The light detection circuit including a pixel circuit, a control unit, a counter, and a processor. The pixel circuit includes a phototransistor, a switching transistor, and an output sub-circuit. A first terminal of the output sub-circuit, a first electrode of the phototransistor, and a first electrode of the switching transistor are coupled to a first node, a gate of the phototransistor is coupled to a gradual change signal input line, a gate of the switching transistor is coupled to a scan line, and a second electrode of the switching transistor is coupled to the counter. The control unit is configured to control the counter to start counting under the control of a scan signal and a synchronization signal.

16 Claims, 7 Drawing Sheets

(56) References Cited

U.S. PATENT DOCUMENTS

| | | | |
|---|---|---|---|
| 2008/0179494 A1* | 7/2008 | Tournier | H01L 27/14601 250/208.1 |
| 2010/0327148 A1* | 12/2010 | Chung | H01L 27/14601 250/208.1 |
| 2011/0108704 A1* | 5/2011 | Kim | H04N 5/3745 250/208.1 |
| 2011/0169843 A1* | 7/2011 | Sasaki | H01L 21/8221 345/519 |
| 2012/0138919 A1* | 6/2012 | Lan | H01L 27/14609 257/43 |
| 2013/0127766 A1* | 5/2013 | Zhao | G06F 3/0412 345/173 |
| 2014/0139492 A1* | 5/2014 | Liu | G06F 3/0412 345/175 |
| 2015/0029421 A1* | 1/2015 | Gu | G06F 3/044 349/12 |
| 2016/0211291 A1* | 7/2016 | Kim | H01L 27/142 |
| 2016/0358956 A1* | 12/2016 | Chang | H01L 27/14612 |
| 2017/0003827 A1* | 1/2017 | Abileah | G02F 1/13338 |
| 2017/0041564 A1* | 2/2017 | Konstantatos | H01L 27/14623 |
| 2017/0104123 A1* | 4/2017 | Ma | H01L 31/1136 |
| 2018/0254419 A1* | 9/2018 | Yu | H01L 51/057 |
| 2019/0043401 A1* | 2/2019 | Wang | G09G 3/20 |
| 2019/0204147 A1* | 7/2019 | Chung | G01J 1/44 |
| 2019/0296177 A1* | 9/2019 | Wang | H01L 31/022408 |

* cited by examiner

LIGHT DETECTION CIRCUIT AND DETECTION METHOD THEREOF, AND LIGHT DETECTION DEVICE

CROSS-REFERENCE TO RELATED APPLICATION

The present disclosure claims priority to the Chinese patent application No. 201810004403.1 filed on Jan. 3, 2018, the entire contents of which are incorporated herein by reference.

TECHNICAL FIELD

The present disclosure relates to the field of light detection technology, and in particular to a light detection circuit and a detection method thereof, and a light detection device.

BACKGROUND

A phototransistor is similar in structure to a conventional transistor, except that a semiconductor layer of the phototransistor is sensitive to optical radiation. In the case that the phototransistor is exposed to light, electrical characteristics of a semiconductor layer of the phototransistor change accordingly. Based on this, a light detection device with a higher sensitivity can be designed.

SUMMARY

The present disclosure provides a light detection circuit and a detection method thereof, and a light detection device.

The light detection circuit includes a pixel circuit, a control unit, a counter, and a processor;

the pixel circuit includes a phototransistor, a switching transistor, and an output sub-circuit, and a threshold voltage of the phototransistor varies with a light intensity received by the phototransistor;

a first terminal of the output sub-circuit, a first electrode of the phototransistor, and a first electrode of the switching transistor are coupled to a first node, a second terminal of the output sub-circuit is coupled to a first power supply terminal, a gate of the phototransistor is coupled to a gradual change signal input line, a second electrode of the phototransistor is coupled to a second power supply terminal, a gate of the switching transistor is coupled to a scan line, and a second electrode of the switching transistor is coupled to a second control terminal of the counter;

control terminals of the control unit are respectively coupled to the scan line and a synchronization signal input line, an output terminal of the control unit is coupled to a first control terminal of the counter, an input terminal of the counter is coupled to a clock signal line, and an output terminal of the counter is coupled to the processor;

the gradual change signal input line is configured to receive a gradual change voltage signal, of which a voltage value changes linearly or in a stepwise manner, the scan line is configured to receive a scan signal, the synchronization signal input line is configured to receive a synchronization signal, and the clock signal line is configured to receive a clock signal for counting;

the output sub-circuit is configured to output a voltage provided by the first power supply terminal to the first node in the case that the phototransistor is turned off;

the control unit is configured to control the counter to start counting under the control of the scan signal and the synchronization signal, and the counter is configured to stop counting in the case that a signal output from the second electrode of the switching transistor changes, obtain a current counting result, and send the current counting result to the processor;

the processor is configured to determine a light intensity currently received by the phototransistor based on the current counting result.

In some embodiments, the processor includes a first query module, and the first query module is configured to query a light intensity corresponding to the current counting result from a pre-stored first counting-light intensity correspondence table, the light intensity corresponding to the current counting result is used as the light intensity currently received by the phototransistor, and counting results output from the counter corresponding to different light intensities received by the phototransistor are stored in the first counting-light intensity correspondence table.

In some embodiments, the processor includes a calculation module and a second query module, the calculation module is configured to calculate a count difference between the current counting result and a pre-stored reference counting result, wherein the reference counting result is a counting result output from the counter in the case that the phototransistor is not exposed to light; and the second query module is configured to query a light intensity corresponding to the count difference from a pre-stored second counting-light intensity correspondence table, the light intensity corresponding to the count difference is used as the light intensity currently received by the phototransistor, and count differences between counting results output from the counter corresponding to different light intensities received by the phototransistor and the reference counting result are stored in the second counting-light intensity correspondence table.

In some embodiments, the control unit is an AND gate circuit, and two signal input terminals of the AND gate circuit are respectively coupled to the synchronization signal input line and the scan line, and a signal output terminal of the AND gate circuit is coupled to the first control terminal of the counter.

In some embodiments, the phototransistor is an N-type transistor and the gradual change voltage signal is a gradual drop voltage signal of which a voltage value drops linearly or in a stepwise manner; or the phototransistor is a P-type transistor and the gradual change voltage signal is a gradual rise voltage signal of which a voltage value rises linearly or in a stepwise manner.

In some embodiments, the phototransistor is a quantum dot oxide-based thin film transistor.

In some embodiments, the output sub-circuit includes a load.

The present disclosure further provides a light detection device, including the light detection circuit above-mentioned.

In some embodiments, the light detection device includes a plurality of the light detection circuits, and the pixel circuits in the plurality of light detection circuits are arranged in an array.

In some embodiments, gates of the phototransistors in the pixel circuits in a same row are coupled to a same gradual change signal input line;

gates of the switching transistors in the pixel circuits in a same row are coupled to a same scan line; and second electrodes of the switching transistors in the pixel circuits in a same column are coupled to a same counter via a same signal transmission line.

The present disclosure provides a light detection method of the light detection circuit above-mentioned, comprising:

providing the gradual change voltage signal to the gate of the phototransistor by the gradual change signal input line such that the phototransistor is turned on, and the phototransistor outputs a voltage provided by the second power supply terminal to the first node; providing the scan signal to the gate of the switching transistor and the control unit by the scan line such that the switching transistor is turned on, and the voltage at the first node is output to the counter via the switching transistor; and providing the synchronization signal to the control unit by the synchronization signal input line and providing the clock signal to the counter by the clock signal line such that the control unit controls the counter to start counting under the control of the scan signal and the synchronization signal;

in the case that the voltage value of the gradual change voltage signal changes to a current threshold voltage of the phototransistor, the phototransistor is turned off, the output sub-circuit outputs a voltage provided by the first power supply terminal to the first node, and a signal output from the second electrode of the switching transistor changes, the counter stops counting, obtains a current counting result, and sends the current counting result to the processor; and the processor determines the light intensity currently received by the phototransistor according to the current counting result.

DETAILED DESCRIPTION

A light detection circuit and a detection method thereof, and a light detection device provided by the present disclosure will be described in detail below in conjunction with the drawings in order that a person skilled in the art can understand the technical solutions of the present disclosure better.

Figure 1:
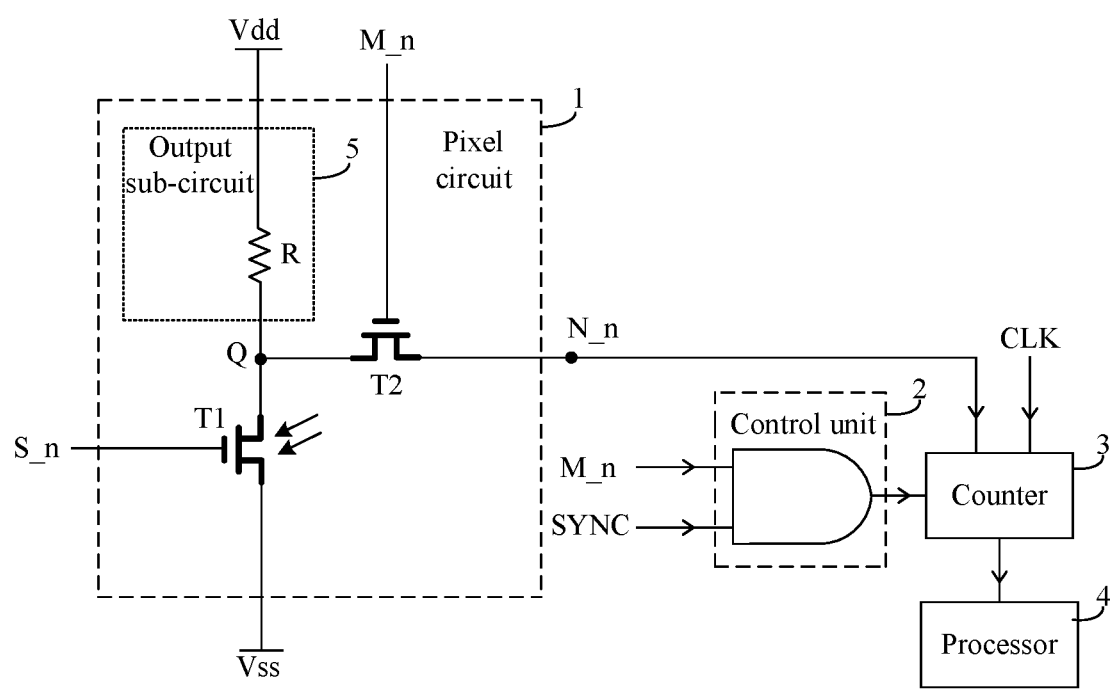
FIG. 1 shows a schematic diagram of a structure of a light detection circuit according to an embodiment of the present disclosure.

FIG. 1 shows a schematic diagram of a structure of a light detection circuit according to an embodiment of the present disclosure. As shown in FIG. 1, the light detection circuit includes a pixel circuit 1, a control unit 2, a counter 3, and a processor 4.

As shown in FIG. 1, the pixel circuit 1 includes a phototransistor T1, a switching transistor T2, and an output sub-circuit 5, a first terminal of the output sub-circuit 5, a first electrode of the phototransistor T1, and a first electrode of the switching transistor T2 are coupled to a first node Q, a second terminal of the output sub-circuit 5 is coupled to a first power supply terminal, a gate of the phototransistor T1 is coupled to a gradual change signal input line S_n, and a second electrode of the phototransistor T1 is coupled to a second power supply terminal, a gate of the switching transistor T2 is coupled to a scan line M_n, and a second electrode of the switching transistor T2 is coupled to a second control terminal of the counter 3.

It should be noted that, a transistor includes three electrodes: a gate, a source, and a drain, and the source and the drain are symmetrical. One of the "first electrode" and "second electrode" mentioned above is the source, and the other is the drain. In particular, the first electrode is the source and the second electrode is the drain in the case that the transistor is an N-type transistor, and thus the transistor is turned on in the case that the gate voltage is a high level. Alternatively the first electrode is the drain and the second electrode is the source in the case that the transistor is a P-type transistor, and thus the transistor is turned on in the case that the gate voltage is a low level.

Control terminals of the control unit 2 are respectively coupled to the scan line M_n and a synchronization signal input line SYNC, and an output terminal of the control unit 2 is coupled to a first control terminal of the counter 3. An input terminal of the counter 3 is coupled to a clock signal line CLK, and an output terminal of the counter 3 is coupled to the processor 4.

The gradual change signal input line S_n is configured to receive a gradual change voltage signal, of which a voltage value changes linearly or in a stepwise manner. The scan line M_n is configured to receive a scan signal, the synchronization signal input line SYNC is configured to receive a synchronization signal, and the clock signal line CLK is configured to receive a clock signal for counting. In some embodiments, the scan signal, the synchronization signal, and the clock signal are voltage signals.

The control unit 2 is configured to control the counter 3 to start counting under the control of the scan signal and the synchronization signal.

The counter 3 is configured to stop counting in the case that a signal output from the second electrode of the switching transistor T2 changes, obtain a current counting result, and send the current counting result to the processor 4.

The processor 4 is configured to determine a light intensity currently received by the phototransistor T1 based on the current counting result.

Figure 2:
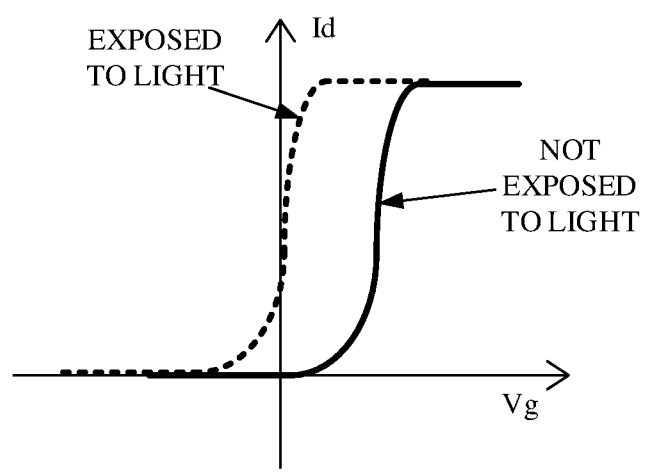
FIG. 2 shows a schematic diagram of a characteristic curve of a quantum dot oxide-based thin film transistor in the case that the quantum dot oxide-based thin film transistor is exposed to light and is not exposed to light.

In the present disclosure, a threshold voltage of the phototransistor varies with the light intensity received by the phototransistor. In some embodiments of the present disclosure, the phototransistor is a Quantum Dot Oxide-based Thin Film Transistor (QDTFT). FIG. 2 shows a schematic diagram of a characteristic curve of a quantum dot oxide-based thin film transistor in the case that the QDTFT is exposed to light and is not exposed to light. In the case that the phototransistor T1 is, for example, a QDTFT, as shown in FIG. 2, the characteristic curve of the QDTFT is wholly shifted to the left after the QDTFT is exposed to light, wherein Vg is a gate voltage and Id is a drain current. That is, the threshold voltage is negatively shifted. A maximum shift measured by an experiment may be from 4V to 8 V which meet the requirement of light detection.

In the present disclosure, the output sub-circuit 5 may be a load R or a phototransistor of which the type is opposite to that of the above-mentioned phototransistor T1 (for example, an N-type phototransistor, a P-type phototransistor), and the gate of the phototransistor is coupled to the gradual change signal input line S_n (not shown). The output sub-circuit is not limited thereto, and may be any other suitable structure. In the following, an exemplary description will be given in the case that the output sub-circuit 5 is a load.

In the present disclosure, the first power supply terminal provides an operation voltage Vdd, and the second power supply terminal provides a ground voltage Vss. An operation process of a light detection circuit according to the present disclosure will be described in detail below with reference to the drawings.

Figure 3:
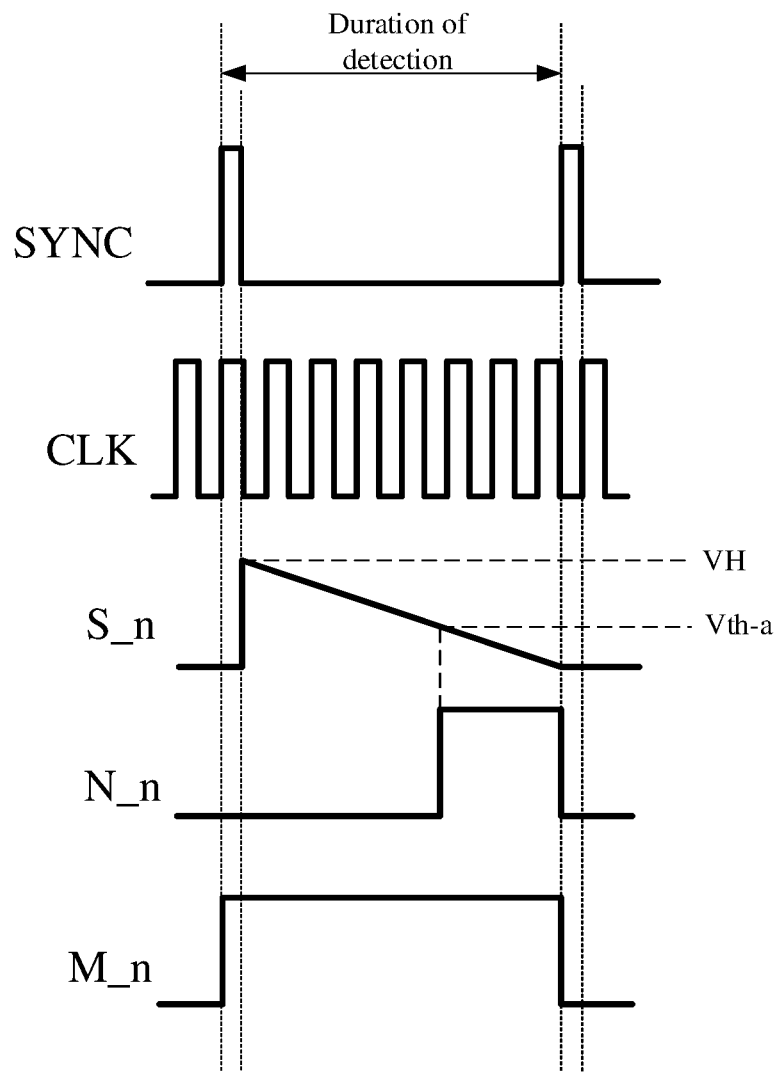
FIG. 3 shows an operation timing diagram of the light detection circuit shown in FIG. 1.

FIG. 3 shows an operation timing diagram of the light detection circuit shown in FIG. 1. As shown in FIG. 3, the phototransistor T1 and the switching transistor T2 are N-type transistors. In this case, the gradual change signal is a gradual drop voltage signal of which a voltage value drops linearly or in a stepwise manner, and a maximum voltage (i.e. an initial voltage) of the gradual drop voltage signal VH is greater than a threshold voltage Vth of the phototransistor T1. The threshold voltage shifts a in the negative direction relative to Vth in the case that the phototransistor T1 is exposed to light, and different light intensities correspond to different values of a. Therefore, the threshold voltage of the phototransistor T1 becomes Vth-a in the case that the phototransistor T1 is exposed to light.

During light detection, the scan line M_n provides a scan signal to the gate of the switching transistor T2 and the control unit 2, the gradual change signal input line S_n provides a gradual change signal to the gate of the phototransistor T1, the synchronization signal input line SYNC provides a synchronization signal to the control unit 2, and the clock signal line CLK provides a clock signal to the counter 3. The synchronization signal is at a valid potential (high level) for a time period which is equal to or less than a half cycle of the clock signal.

In an initial stage, the switching transistor T2 is in an on-state, since the scan line M_n provides the scan signal to the gate of the switching transistor T2 and the control unit 2. Since the initial voltage VH of the gradual change voltage signal is greater than the threshold voltage of the phototransistor T1, the phototransistor T1 is in an on-state. Thus the second terminal N_n of the switching transistor T2 outputs the ground voltage Vss. At the same time, the control unit 2 controls the counter 3 to reset and start counting under the control of the scan signal and the synchronization signal.

In some embodiments, the control unit 2 is an AND gate circuit. Two signal input terminals of the AND gate circuit (i.e., control terminals of the control unit 2) are respectively coupled to the synchronization signal input line SYNC and the scan line M_n, and a signal output terminal of the AND gate circuit is coupled to the first control terminal of the counter 3. The AND gate circuit outputs a high level only in the case that the scan signal and the synchronization signal are at a high level at the same time, otherwise the AND gate circuit outputs a low level. The counter 3 resets and starts counting only in the case that the AND gate circuit outputs a high level. Those skilled in the art should know that the control unit 2 in the present disclosure may also be any other suitable structure having a control function.

In a subsequent process, the voltage of the gradual change signal decreases uniformly. It drops to Vth-a at a certain moment and the phototransistor T1 is turned off. Since the switching transistor T2 is still in the on-state, the operation voltage Vdd is transmitted to the counter 3 through the load R and the switching transistor T2. That is, a signal output from the second terminal N_n of the switching transistor T2 changes (from Vss to Vdd), which causes the counter 3 to stop counting, and a current counting result is obtained, and sent to the processor 4.

This current counting result corresponds to a time period during which the gradual change signal decreases from VH to Vth-a. In the case that the light intensity received by the phototransistor T1 changes, the value of a changes accordingly (that is, the value of Vth-a changes accordingly). Therefore the time period during which the gradual change signal decreases from VH to Vth-a changes correspondingly, that is, the counting result changes correspondingly.

Based on the above principle, the processor 4 may determine a light intensity currently received by the phototransistor T1 according to the current counting result output from the counter 3.

In some embodiments, the processor 4 for determining a light intensity according to the current counting result includes a first query module 41. The first query module 41 is configured to query a light intensity corresponding to the current counting result from a pre-stored first counting-light intensity correspondence table. The light intensity corresponding to the current counting result is used as the light intensity currently received by the phototransistor T1. The first counting-light intensity correspondence table stores counting results, which are obtained through an preliminary experiment, output from the counter 3 corresponding to different light intensities received by the phototransistor T1.

In the present disclosure, the phototransistor T1 ages and the threshold voltage shifts as a use time of the phototransistor T1 is increased. In this case, the aged phototransistor T1 may be subjected to another preliminary experiment to generate a new first counting-light intensity correspondence table. Then the previous first counting-light intensity correspondence table in the first query module 41 may be updated to ensure the accuracy of the detection result.

In some embodiments, the processor 4 for determining a light intensity according to the current counting result comprises a calculation module 43 and a second query module 42, and the calculation module 43 is configured to calculate a count difference between the current counting result and a pre-stored reference counting result. The reference counting result is a counting result output from the counter 3 obtained through a preliminary experiment in which the phototransistor T1 is not exposed to light. The count difference corresponds to the time period during which the gradual change signal decreases from VH to Vth-a, i.e., the count difference may be used for characterizing the threshold voltage shift a of the phototransistor T1 and thus characterizing the light intensity currently received by the phototransistor T1. The second query module 42 is configured to query a light intensity corresponding to the count difference from a pre-stored second counting-light intensity correspondence table. The light intensity corresponding to the count difference is used as the light intensity currently received by the phototransistor T1. The second counting-light intensity correspondence table stores count differences, which are obtained through an preliminary experiment, between counting results output from the counter 3 corresponding to different light intensities received by the phototransistor T1 and the reference counting result.

Based on the above, the light detection circuit provided by the present disclosure may accurately detect an external light intensity with the phototransistor T1.

It should be noted that, FIG. 3 only shows that the gradual change signal is a gradual drop voltage signal of which a voltage value drops linearly. In the case that the gradual change signal is a gradual drop voltage signal of which a voltage value drops uniformly in a stepwise manner (not shown), a time width of each step of the gradual drop voltage signal and a counting period of the counter (usually, a minimum counting period of the counter, i.e., twice a half period of a periodic clock signal with a duty ratio of 50% is used) may be the same to ensure the accuracy of the counting result.

Furthermore, the phototransistor T1 in the present disclosure may be a P-type transistor. In this case, the gradual change signal is a gradual rise voltage signal of which a voltage value rises linearly or rises in a stepwise manner. A minimum voltage of the gradual rise voltage signal is lower than the threshold voltage of the phototransistor T1. An operation process of this P-type phototransistor T1 corresponds to that of the N-type phototransistor T1 aforementioned, which will not be repeated here.

The switching transistor T2 in the present disclosure may also be a P-type transistor. In this case, an active level of the scan line M_n, particularly a level that causes the switching transistor T2 to be turned on, is a low level.

Figure 4:
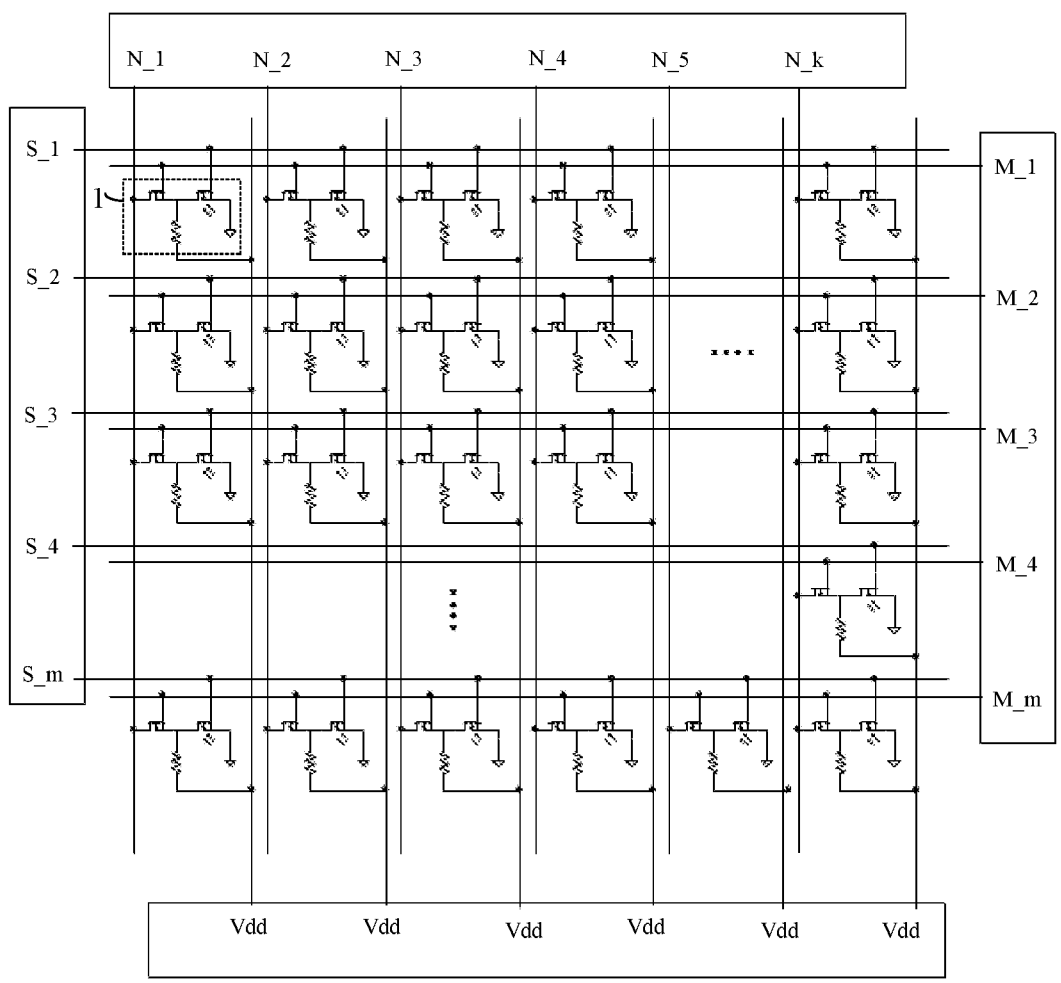
FIG. 4 shows a schematic diagram of a structure of a light detection device according to an embodiment of the present disclosure.
Figure 5:
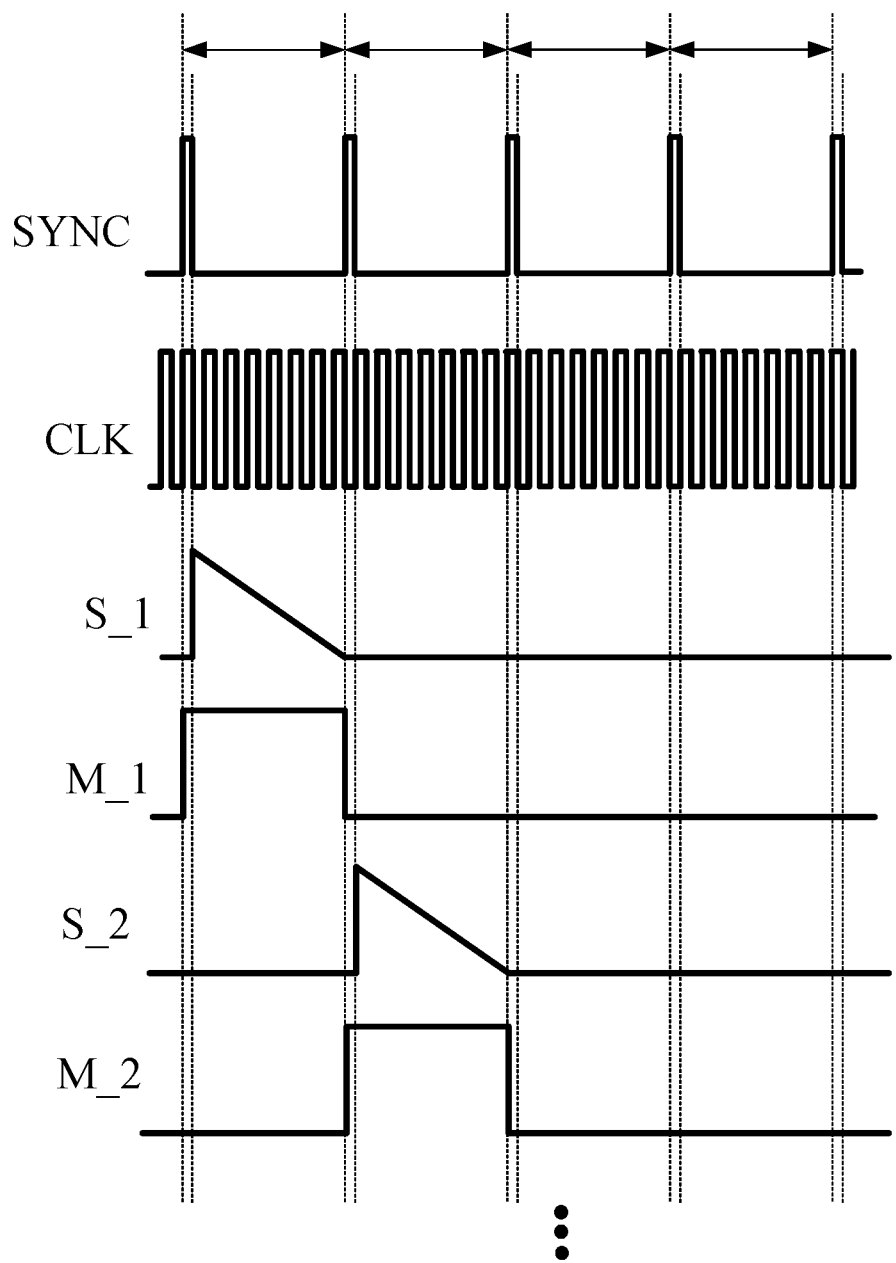
FIG. 5 shows an operation timing diagram of the light detection device shown in FIG. 4.

FIG. 4 shows a schematic diagram of a structure of a light detection device according to an embodiment of the present disclosure. FIG. 5 shows an operation timing diagram of the light detection device shown in FIG. 4. As shown in FIG. 4 and FIG. 5, the light detection device includes a light detection circuit in the above embodiment.

In some embodiments, as shown in FIG. 4, the light detection device includes a plurality of light detection circuits. Pixel circuits 1 of the plurality of light detection circuits are arranged in an array, and the pixel circuits 1 are located at a middle region of the light detection device, and the control unit, the counter, and the processor (all not shown) are located at a peripheral region of the light detection device or integrated in a chip.

In some embodiments, as shown in FIG. 4, the gates of the phototransistors T1 of the pixel circuits 1 in a same row are coupled to a same gradual change signal input line, for example, S_1, S_2, S_3, S_4 . . . S_m. The gates of the switching transistors T2 of the pixel circuits 1 in a same row are coupled to a same scan line, for example, M_1, M_2, M_3, M_4 . . . M_m. The second electrodes of the switching transistors T2 of the pixel circuits 1 in a same column are coupled to a same counter via a same signal transmission line, for example, N_1, N_2, N_3, N_4 . . . N_k. The number of the lines in the light detection device may be effectively reduced and a light detection resolution of the light detection device may be effectively improved by using the common gradual change signal input lines S_1, S_2, S_3, S_4 . . . S_m, the common scan lines M_1, M_2, M_3, M_4 . . . M_m, and the common signal transmission lines N_1, N_2, N_3, N_4 . . . N_k. Furthermore, the pixel circuits 1 in a same column share a same counter, which may effectively reduce the number of counters and thus reduce production cost.

As shown in FIG. 5, the light detection device may be driven to operate by scanning the pixel circuits 1 in a row-by-row manner with the scan lines. The pixel circuits 1 in the light detection device output respective signals to the corresponding counters in a row-by-row manner such that the corresponding processors may determine light intensities received by the phototransistors T1 of the pixel circuits 1.

It should be noted that, in the case that the processor 4 includes the first query module 41, each light detection circuit needs to pre-store a corresponding first counting-light intensity correspondence table, as the phototransistors T1 of the pixel circuits 1 may have different characteristics, particularly the threshold voltage Vth, due to different manufacturing processes. It is assumed that the light detection device includes m×k pixel circuits 1, it is necessary to pre-store m×k first counting-light intensity correspondence table.

In the case that the processor 4 includes the calculation module 43 and the second query module 42, the count difference calculated by the calculation module 43 is used to characterize the light intensity currently received by the phototransistor, and the characteristic differences among the phototransistors may be effectively compensated. Therefore, all the light detection circuits may correspond to a same second counting-light intensity correspondence table. It is assumed that the light detection device includes m×k pixel circuits 1, only one second counting-light intensity correspondence table needs to be pre-stored and thereby the data storage capacity required may be effectively reduced.

Figure 6:
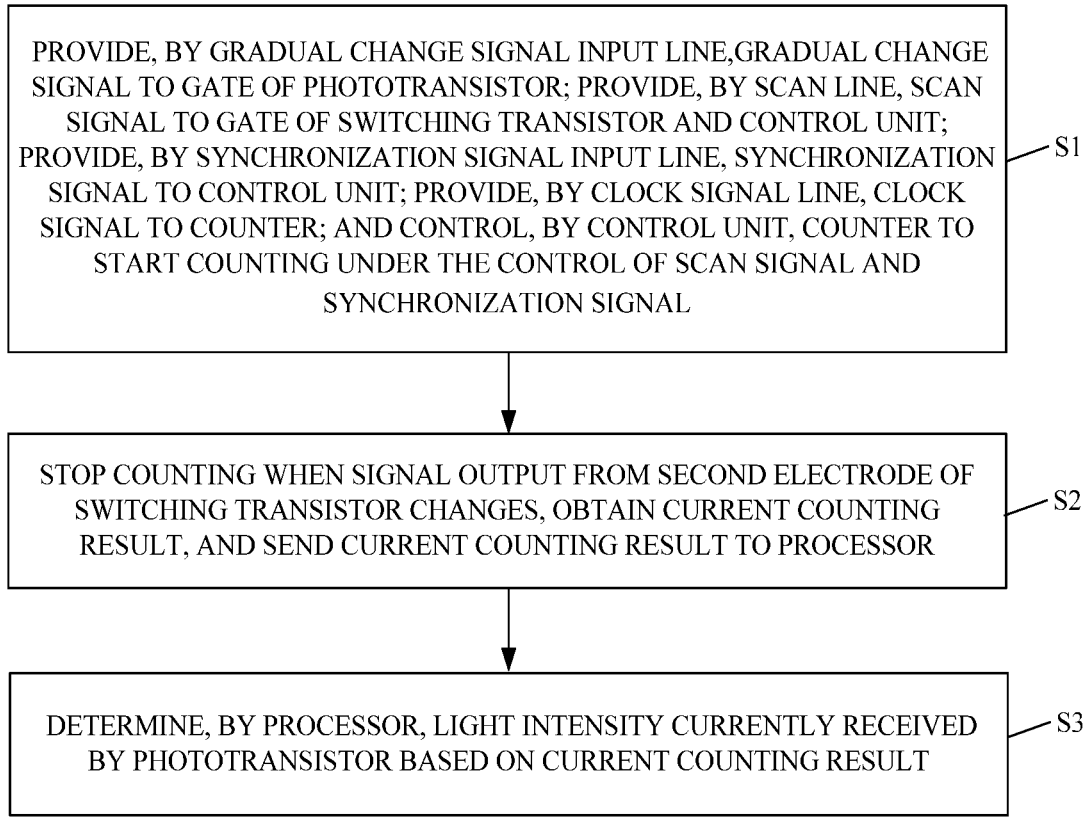
FIG. 6 shows a flowchart of a light detection method according to an embodiment of the present disclosure.
Figure 7:
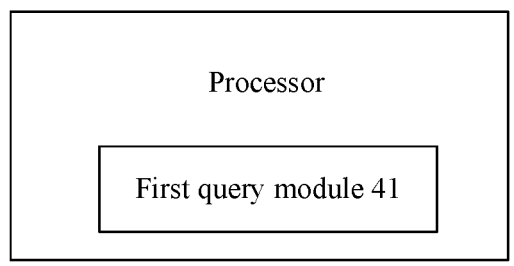
FIG. 7 shows a schematic diagram of a structure of a processor according to an embodiment of the present disclosure.
Figure 8:
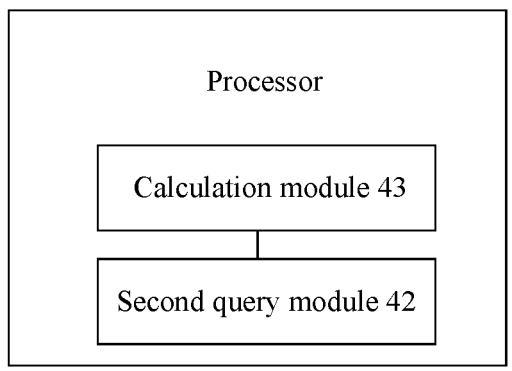
FIG. 8 shows a schematic diagram of a structure of a processor according to an embodiment of the present disclosure.

FIG. 6 shows a flowchart of a light detection method according to an embodiment of the present disclosure. As shown in FIG. 6, the light detection method is based on the light detection circuit in the above embodiment. The light detection method includes steps S1 to S3.

At step S1, the gradual change signal input line provides a gradual change signal to the gate of the phototransistor, the phototransistor is turned on, and the phototransistor outputs a voltage provided by the second power supply terminal to the first node; the scan line provides a scan signal to the gate of the switching transistor and the control unit, the switching transistor is turned on, and the voltage at the first node is output to the counter via the switching transistor; the synchronization signal input line provides a synchronization signal to the control unit, the clock signal line provides a clock signal to the counter, and the control unit controls the counter to start counting under the control of the scan signal and the synchronization signal.

At step S2, in the case that the voltage value of the gradual change signal changes to the current threshold voltage of the phototransistor, the phototransistor is turned off, the output sub-circuit outputs a voltage provided by the first power supply terminal to the first node, and a signal output from the second electrode of the switching transistor changes, the counter stops counting and obtains a current counting result, and sends the current counting result to the processor.

At step S3, the processor determines a light intensity currently received by the phototransistor according to the current counting result.

In the step S3, in some embodiments, the processor 4 includes a first query module 41. The first query module 41 is configured to query a light intensity corresponding to the current counting result from a pre-stored first counting-light intensity correspondence table. The light intensity corresponding to the current counting result is used as the light intensity currently received by the phototransistor. The first counting-light intensity correspondence table stores counting results output from the counter corresponding to different light intensities received by the phototransistor.

In some embodiments, the processor 4 includes a calculation module 43 and a second query module 42. The calculation module 43 is configured to calculate a count difference between the current counting result and a pre-stored reference counting result. The reference counting result is a counting result output from the counter in the case that the phototransistor is not exposed to light. The second query module 42 is configured to query a light intensity corresponding to the count difference from a pre-stored second counting-light intensity correspondence table. The light intensity corresponding to the count difference is used as the light intensity currently received by the phototransistor. The second counting-light intensity correspondence table stores count differences between counting results output from the counter 3 corresponding to different light intensities received by the phototransistor T1 and the reference counting result.

Detailed descriptions of the above steps S1 to S3 are not repeated herein, which may be known from corresponding contents in the abovementioned embodiments.

Flowcharts and block diagrams in the figures illustrate architectures, functionalities, and operations of systems, methods, and computer program products according to various embodiments of the present disclosure which can be performed. In this regard, each block of the flowcharts or block diagrams may represent a portion, a program segment, or a part of code, and the portion, the program segment, or the part of the code includes at least one executable instruction for performing a specified logic function. It should also be noted that, in some alternative implementations, the functions in the blocks may be performed in a different order relative to those in the figures. For example, two blocks represented as a sequential connection may be performed substantially in parallel, and may sometimes be performed in a reverse order according to functions involved. It should also be noted that, each block of the block diagrams and/or flowcharts, and combinations of the blocks can be performed by a special purpose hardware-based system that performs specified functions or operations, or can be performed by a combination of a special purpose hardware and computer instructions.

Components or portions involved in the embodiments of the present disclosure may be performed through software or hardware. The described components or portions may also be provided in a processor. For example, each of the components or portions may be a software program installed in a computer or a mobile smart device, or may be a separately configured hardware device. In some cases, these components or portions are not limited by their title.

It will be appreciated that above implementations are only exemplary implementations for illustrating the principle of the disclosure, and the present disclosure is not limited thereto. An ordinary person skilled in the art may make various modifications and improvements without departing from the spirit and essence of the present disclosure. These modifications and improvements should be considered as the protective scope of the present disclosure.

What is claimed is:

1. A light detection circuit, comprising a pixel circuit, a control unit, a counter, and a processor, wherein,
   the pixel circuit comprises a phototransistor, a switching transistor, and an output sub-circuit, and a threshold voltage of the phototransistor varies with a light intensity received by the phototransistor;
   a first terminal of the output sub-circuit, a first electrode of the phototransistor, and a first electrode of the switching transistor are coupled to a first node, a second terminal of the output sub-circuit is coupled to a first power supply terminal, a gate of the phototransistor is coupled to a gradual change signal input line, a second electrode of the phototransistor is coupled to a second power supply terminal, a gate of the switching transistor is coupled to a scan line, and a second electrode of the switching transistor is coupled to a second control terminal of the counter;
   control terminals of the control unit are respectively coupled to the scan line and a synchronization signal input line, an output terminal of the control unit is coupled to a first control terminal of the counter, an input terminal of the counter is coupled to a clock signal line, and an output terminal of the counter is coupled to the processor;
   the gradual change signal input line is configured to receive a gradual change voltage signal, of which a voltage value changes linearly or in a stepwise manner, the scan line is configured to receive a scan signal, the synchronization signal input line is configured to receive a synchronization signal, and the clock signal line is configured to receive a clock signal for counting;
   the output sub-circuit is configured to output a voltage provided by the first power supply terminal to the first node in a case that the phototransistor is turned off;
   the control unit is configured to control the counter to start counting under the control of the scan signal and the synchronization signal, and the counter is configured to stop counting in a case that a signal output from the second electrode of the switching transistor changes, obtain a current counting result, and send the current counting result to the processor; and
   the processor is configured to determine a light intensity currently received by the phototransistor based on the current counting result.

2. The light detection circuit of claim 1, wherein the processor comprises a first query module, and
   the first query module is configured to query a light intensity corresponding to the current counting result from a pre-stored first counting-light intensity correspondence table, the light intensity corresponding to the current counting result is used as the light intensity currently received by the phototransistor, and counting results output from the counter corresponding to different light intensities received by the phototransistor are stored in the first counting-light intensity correspondence table.

3. The light detection circuit of claim 1, wherein the processor comprises a calculation module and a second query module,
   the calculation module is configured to calculate a count difference between the current counting result and a pre-stored reference counting result, wherein the reference counting result is a counting result output from the counter in a case that the phototransistor is not exposed to light; and
   the second query module is configured to query a light intensity corresponding to the count difference from a pre-stored second counting-light intensity correspondence table, the light intensity corresponding to the count difference is used as the light intensity currently received by the phototransistor, and count differences between counting results output from the counter corresponding to different light intensities received by the phototransistor and the reference counting result are stored in the second counting-light intensity correspondence table.

4. The light detection circuit of claim 1, wherein the control unit is an AND gate circuit, and two signal input terminals of the AND gate circuit are respectively coupled to the synchronization signal input line and the scan line, and a signal output terminal of the AND gate circuit is coupled to the first control terminal of the counter.

5. The light detection circuit of claim 1, wherein,
the phototransistor is an N-type transistor and the gradual change voltage signal is a gradual drop voltage signal of which a voltage value drops linearly or in a stepwise manner; or
the phototransistor is a P-type transistor and the gradual change voltage signal is a gradual rise voltage signal of which a voltage value rises linearly or in a stepwise manner.

6. The light detection circuit of claim 1, wherein the phototransistor is a quantum dot oxide-based thin film transistor.

7. The light detection circuit of claim 1, wherein the output sub-circuit comprises a load.

8. A light detection device, comprising a plurality of light detection circuits of claim 1, wherein the pixel circuits in the plurality of the light detection circuits are arranged in an array.

9. The light detection device of claim 8, wherein,
gates of the phototransistors in the pixel circuits in a same row are coupled to a same gradual change signal input line;
gates of the switching transistors in the pixel circuits in a same row are coupled to a same scan line; and
second electrodes of the switching transistors in the pixel circuits in a same column are coupled to a same counter via a same signal transmission line.

10. The light detection device of claim 9, wherein the processor comprises a first query module, and
the first query module is configured to query a light intensity corresponding to the current counting result from a pre-stored first counting-light intensity correspondence table, the light intensity corresponding to the current counting result is used as the light intensity currently received by the phototransistor, and counting results output from the counter corresponding to different light intensities received by the phototransistor are stored in the first counting-light intensity correspondence table.

11. The light detection device of claim 9, wherein the processor comprises a calculation module and a second query module,
the calculation module is configured to calculate a count difference between the current counting result and a pre-stored reference counting result, wherein the reference counting result is a counting result output from the counter in a case that the phototransistor is not exposed to light; and
the second query module is configured to query a light intensity corresponding to the count difference from a pre-stored second counting-light intensity correspondence table, the light intensity corresponding to the count difference is used as the light intensity currently received by the phototransistor, and count differences between counting results output from the counter corresponding to different light intensities received by the phototransistor and the reference counting result are stored in the second counting-light intensity correspondence table.

12. The light detection device of claim 9, wherein the control unit is an AND gate circuit, and two signal input terminals of the AND gate circuit are respectively coupled to the synchronization signal input line and the scan line, and a signal output terminal of the AND gate circuit is coupled to the first control terminal of the counter.

13. The light detection device of claim 9, wherein,
the phototransistor is an N-type transistor and the gradual change voltage signal is a gradual drop voltage signal of which a voltage value drops linearly or in a stepwise manner; or
the phototransistor is a P-type transistor and the gradual change voltage signal is a gradual rise voltage signal of which a voltage value rises linearly or in a stepwise manner.

14. The light detection device of claim 9, wherein the phototransistor is a quantum dot oxide-based thin film transistor.

15. The light detection device of claim 9, wherein the output sub-circuit comprises a load.

16. A light detection method of the light detection circuit of claim 1, comprising:
providing the gradual change voltage signal to the gate of the phototransistor by the gradual change signal input line such that the phototransistor is turned on, and the phototransistor outputs a voltage provided by the second power supply terminal to the first node;
providing the scan signal to the gate of the switching transistor and the control unit by the scan line such that the switching transistor is turned on, and the voltage at the first node is output to the counter via the switching transistor; and
providing the synchronization signal to the control unit by the synchronization signal input line and providing the clock signal to the counter by the clock signal line such that the control unit controls the counter to start counting under the control of the scan signal and the synchronization signal;
wherein in a case that the voltage value of the gradual change voltage signal changes to a current threshold voltage of the phototransistor, the phototransistor is turned off, the output sub-circuit outputs a voltage provided by the first power supply terminal to the first node, and a signal output from the second electrode of the switching transistor changes, the counter stops counting, obtains a current counting result, and sends the current counting result to the processor; and
the processor determines the light intensity currently received by the phototransistor according to the current counting result.

* * * * *